United States Patent
Bechtold et al.

(10) Patent No.: US 6,777,939 B2
(45) Date of Patent: Aug. 17, 2004

(54) COIL SYSTEM WITH CURRENT REGULATION BASED ON EMITTED HEAT

(75) Inventors: Mario Bechtold, Hemhofen (DE); Ralph Oppect, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/374,714

(22) Filed: Feb. 27, 2003

(65) Prior Publication Data

US 2003/0160613 A1 Aug. 28, 2003

(30) Foreign Application Priority Data

Feb. 27, 2002 (DE) .......................................... 102 08 482

(51) Int. Cl.⁷ .................................................. G01V 3/00
(52) U.S. Cl. ..................................... 324/322; 324/318
(58) Field of Search ................................. 324/322, 318, 324/315, 300, 306, 307, 309, 312, 314

(56) References Cited

U.S. PATENT DOCUMENTS

| 4,663,592 A | 5/1987 | Yamaguchi et al. |
| 5,661,401 A | 8/1997 | Ishikawa et al. |
| 6,313,630 B1 * | 11/2001 | Ganin et al. .................. 324/312 |
| 6,541,972 B2 * | 4/2003 | Mulder et al. ............... 324/318 |
| 2001/0024122 A1 | 9/2001 | Mulder |
| 2002/0079893 A1 | 6/2002 | Roeckelein et al. |

FOREIGN PATENT DOCUMENTS

| DE | 195 11 791 C1 | 8/1996 |
| DE | 199 22 652 C2 | 1/2001 |
| DE | 100 30 142 C1 | 1/2002 |
| DE | 100 47 584 A1 | 5/2002 |
| FR | 2 597 656 | 10/1987 |
| GB | 0 219 406 | 12/1989 |
| JP | 08-215168 | 8/1996 |
| WO | 00/54069 | 9/2000 |

* cited by examiner

*Primary Examiner*—Louis Arana
(74) *Attorney, Agent, or Firm*—Staas & Halsey LLP

(57) ABSTRACT

An amplifier and a coil are electrically connected to an amplifier in a coil system. A current controller is provided for adjustment of the current which is supplied from the amplifier to the coil. The current controller adjusts the current such that, at least on average, a predetermined power loss is converted to heat in the coil.

16 Claims, 3 Drawing Sheets

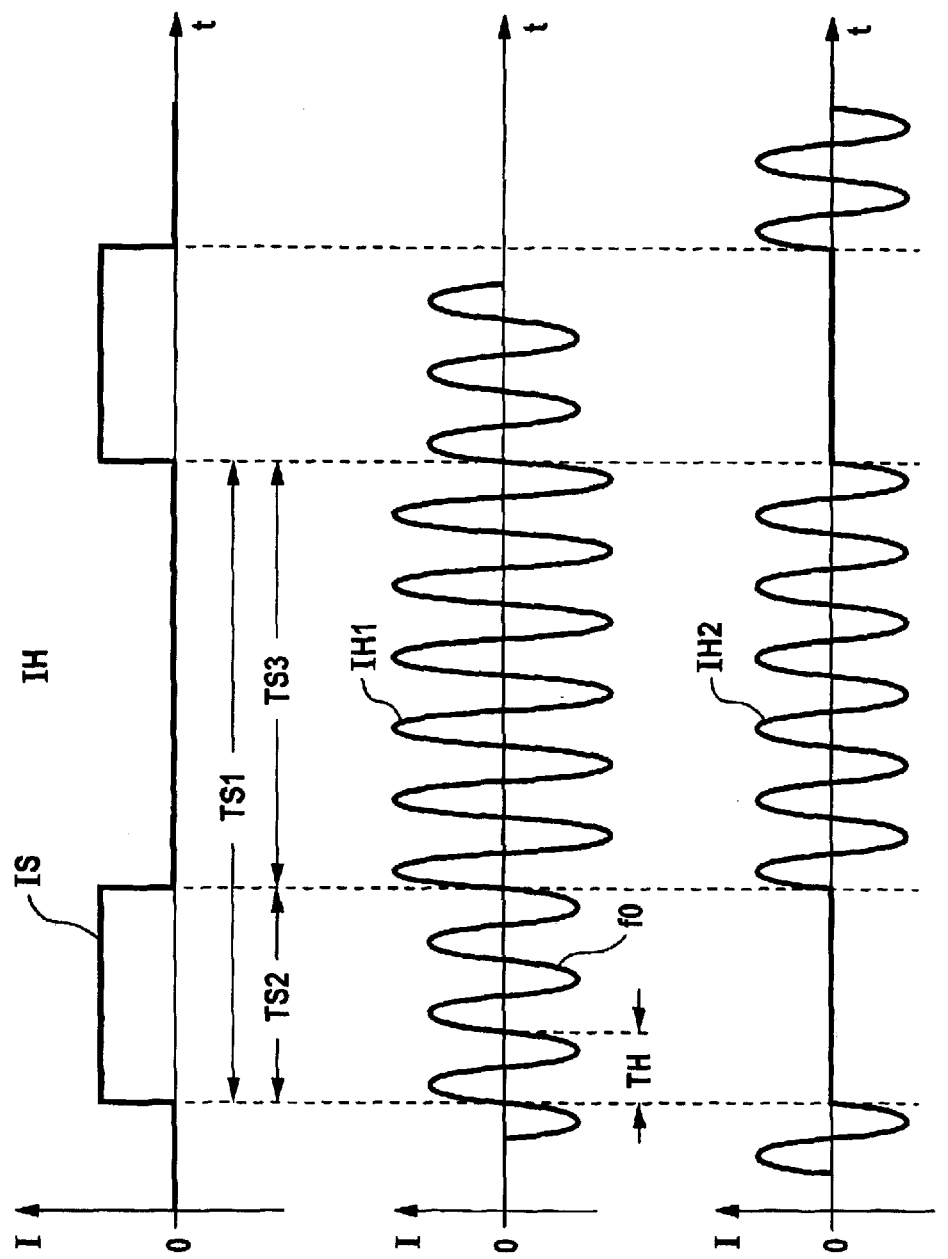

COIL SYSTEM WITH CURRENT REGULATION BASED ON EMITTED HEAT

CROSS REFERENCE TO RELATED APPLICATIONS

This application is based on and hereby claims priority to German Application No. 102 08 482.3 filed on Feb. 27, 2002, the contents of which are hereby incorporated by reference.

BACKGROUND OF THE INVENTION

1. Field of the Invention

The invention relates to a coil system having an amplifier and having at least one coil which is electrically connected to the amplifier. The coil system is intended in particular for use in a magnetic resonance appliance.

2. Description of the Related Art

Magnetic resonance technology is a known technique for obtaining images of the interior of the body of an object that is being examined or investigated. In this case, gradient fields which are switched at high speed and are produced by a gradient coil system are superimposed on a static basic magnetic field, which is produced by a basic field magnet system, in a magnetic resonance appliance. Furthermore, the magnetic resonance appliance has a radio-frequency system which injects radio-frequency signals into the investigation object to produce magnetic resonance signals, and which receives the magnetic resonance signals that are produced and on whose basis magnetic resonance images are produced.

In this case, a high degree of homogeneity of the basic magnetic field is a critical factor for the quality of the magnetic resonance images. Inhomogeneities of the basic magnetic field within an imaging volume of the magnetic resonance appliance cause geometric distortion of the magnetic resonance image, with this distortion in proportion to the inhomogeneities. The field homogeneity is particularly important for so-called fast pulse sequences, for example for the echo planar process.

So-called shim systems are used to improve the basic magnetic field homogeneity within the imaging volume. In this case, a distinction is drawn between passive and active shim systems.

In a passive shim system, a number of iron plates are fitted arranged in a suitable manner in the examination area of the appliance. The basic magnetic field within the imaging volume is measured for this purpose before the iron plates are fitted. The measured values are used by a computation program to determine the suitable number and arrangement of the iron plates. A passive shim system with a specific calculation process for the number, thicknesses and positions of the individual iron shim plates is described, by way of example, in DE 19922652 C2.

In an active shim system, on the other hand, shim coils to which direct currents can be applied are used to homogenize the basic magnetic field. Operation of the shim coils requires power supply units which supply very constant and reproducibly adjustable direct currents. The active shim system is used, inter alia, for fine correction when a very high degree of homogeneity is required, for example in order to correct field distortion caused by the susceptibility of the object that is being examined and is at least partially located in the imaging volume. An active shim system with a specific adjustment process for the currents which are fed into at least one of the shim coils and gradient coils is described, by way of example, in DE 10030142 C1.

Furthermore, it is known from DE 19511791 C1 for linear inhomogeneity of the basic magnetic field, that is to say a first-order field disturbance, to be corrected by applying an offset current to a gradient coil. In this case, the offset current is a constant current, which is superimposed on a gradient coil current which carries out a gradient sequence. This approach is based on the idea that the basic magnetic field within the imaging volume can be described by coefficients of a spherical function series development. Higher-order field inhomogeneities are no longer compensated for by the gradient coils but by a number of shim coils which essentially each compensate for one of the spherical function coefficients. Nine shim coils are generally used for this method, so that, together with the three gradient coils, it is possible to compensate for the 12 spherical function coefficients which disturb the field homogeneity to the greatest extent.

The known methods and systems for improving the basic magnetic field homogeneity are either very complex to implement, as in the case of active shim systems, or, like passive shim systems, suffer from their compensating effect being dependent on the temperature. This is because the magnetic characteristic of the iron shim plates is dependent on temperature, so that the shim state and hence the basic magnetic field homogeneity vary with temperature.

SUMMARY OF THE INVENTION

An object of the invention is therefore to specify a system which is suitable for improving the basic magnetic field homogeneity, is easy to implement, and is also largely independent of temperature.

A coil system according to the invention has at least one amplifier, a coil which is electrically connected to the amplifier, as well as a current controller or current control means for adjusting the current which is supplied from the amplifier to the coil such that, at least on average, a predetermined power loss is converted to heat in the coil.

The invention is in this case based on the knowledge that the main heat input which leads to a temperature change in passive iron shim plates is produced by the current flow in the gradient coils. Depending on the sequence current which is flowing at any given time in one of the relevant gradient coils, the passive iron shim plates which are arranged adjacent to the gradient coils are either heated, or are cooled down again, for example during the sequence pauses. It has been found that the disturbing temperature influence on the passive iron shim plates can be overcome by applying additional current to the (gradient) coil. The additional current component which is fed into the coil is in this case of such a magnitude that the total current flowing overall in the coil is at least equal to the maximum sequence current that occurs during normal operation. The electrical power loss which is caused by the total current in the coil is therefore then also approximately equal to the power loss which would otherwise occur only when the maximum sequence current is flowing.

As a consequence of this, the coil also emits an approximately constant amount of heat, at least when averaged over time. After a thermal starting phase, which follows the magnetic resonance appliance being switched on, the iron shim plates which are arranged in the immediate vicinity are in a largely homogeneous temperature field. This overcomes the temperature-dependent fluctuations of the magnetic characteristics of the iron shim plates, and compensation is always provided in virtually the same way for the basic magnetic field throughout the actual operation period.

The current control means that are additionally provided and the application of an additional current component associated with this to the coil can thus be used firstly for the passive iron shim plates, which are less complex than the active shim coils, but while on the other hand also at the same time avoiding the otherwise normal temperature dependency of the compensation when using iron shim plates.

The fact that the additional heat is produced in precisely the same place as that in which the heat which is a function of time as a result of the sequence currents is also produced, namely in the coil itself, is also critical for advantageous effects. No significant additional components, for example in the form of separate heating elements or else separate power electronics, are thus required for the additional heating. Components which are present in any case are primarily used for the amplifier and the coil. This also considerably reduces the complexity level required for implementation. Furthermore, a conventional coil system can easily be retrofitted since, essentially, it is possible to use the existing components.

The current which is fed into the coil preferably contains a first component which is used in the coil to produce the graded field strength. This is a so-called pulse current or sequence current, which is repeated at cyclic intervals. The first current component is referred to as the sequence current component here. A second current component, which is referred to as the heating current component here, is also fed into the coil. The heating current component is not used for field production but for heating, and is of such a magnitude that the total amount of heat emitted from the coil corresponds to a predetermined value.

In particular, the heating current component has no mean value. For example, it may be in the form of a periodic alternating current signal or else, in particular, in the form of a sinusoidal alternating current signal. The critical factor for imaging with a magnetic resonance appliance is always the integral of the gradient field strength over time. It is therefore advantageous for the time integral of the heating current component to be averaged at least within the time period in which the sequence current component is not equal to zero. This avoids any undesirable effect of the heating current component influencing the field.

For the heating current component to have as little field producing effect as possible, it is advantageous for a frequency of the heating current component to be synchronized to a clock frequency which is present in any case, in particular in a magnetic resonance appliance. If the frequency of the heating current component and, in particular, the switching clock for the sequence current component are synchronized to one another, this is particularly advantageous in terms of the heating current component having a negligible mean value during the sequence period of the sequence current component.

The time integral, determined over the sequence period of the sequence current component, of the heating current component advantageously assumes the value zero. As far as possible, this should be true for all feasible sequence periods. This is because different sequence periods may be used during operation of a magnetic resonance appliance. In particular, the time integral should assume the value zero even for the shortest sequence period. The field which is produced by the sequence current component is then virtually uninfluenced by the heating current component.

It is likewise possible for the sequence and heating current components to be separated in time. In this case, the sequence current component assumes a value other than zero only during the sequence pauses. This makes it possible to virtually preclude any disturbing influence from the heating current component on the gradient field from the start. Such time decoupling of the two current components is particularly advantageous when the period duration of the sequence current component is shorter than the thermal time constant.

In one advantageous embodiment, the current controller is designed such that the heating current component is appropriately slaved to the sequence current component at that time, so that the total heating power components produced by the two current components are equal to a predetermined value. This predetermined value may, for example, represent the heating power produced by the highest possible sequence current.

It is also advantageous for the coil with a regulated current supply to be a z-gradient coil of a magnetic resonance appliance. Owing to the specific spatial arrangement, a z-gradient coil such as this results in a greater heat input than x-gradient and y-gradient coils. If the amount of heat that is input differs to a very major extent, it may therefore be sufficient to equip only the z-gradient coil with current control means for the additional application of a heating current component. This contributes to reducing the power that is drawn and, furthermore, to reducing the complexity.

It is advantageous to include a detector providing detection means for detecting the heat power which is emitted from the coil. In particular, a real power sensor is in this case used for detection of total real power that is fed into the coil, or else at least one temperature sensor may be used, which is fitted, by way of example, in the vicinity of iron shim plates. The heating current component can then be readjusted as appropriate on the basis of the information obtained by using the detection means.

In particular, a current regulation control loop is provided as a component of the current control means for this purpose.

In a further variant, the disturbance influence of the heat current component is further reduced by the coil conductor being subdivided into two strand elements. This can be achieved without any problems, especially if the coil contains a stranded conductor. One half of the individual strands is then joined together to form a first conductor element, and the second half is joined together to form a second conductor element. The two conductor elements formed in this way are advantageously arranged in a bifilar manner, so that the heating current component does not produce any field. Furthermore, the bifilar arrangement has very low self-inductance, so that a heating current component can be fed in even at a relatively high frequency without any problems. By way of example, a frequency of 10 MHz is used. The high heating frequency in this case results in more heating power than a lower heating frequency owing to the thinner skin depth.

The two conductor elements of the coil are preferably short-circuited to one another at one of their ends and are connected at their other respective end such that they can selectively be operated with short-circuited or disconnected second conductor ends. Short-circuited operation is intended in particular for the sequence current component while, on the other hand, operation with disconnected second conductor ends is intended for the heating current component. An example of circuitry which is suitable for this purpose has a bandstop filter which is matched to the frequency of the heating current component, a bandpass filter which is matched to the same frequency, as well as a differential transformer.

Preferred exemplary embodiments of the coil system will now be explained in more detail with reference to the drawing, but without these exemplary embodiments having any restrictive effect whatsoever. To make it clear, the drawing is not to scale, and certain features are illustrated schematically. In detail:

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
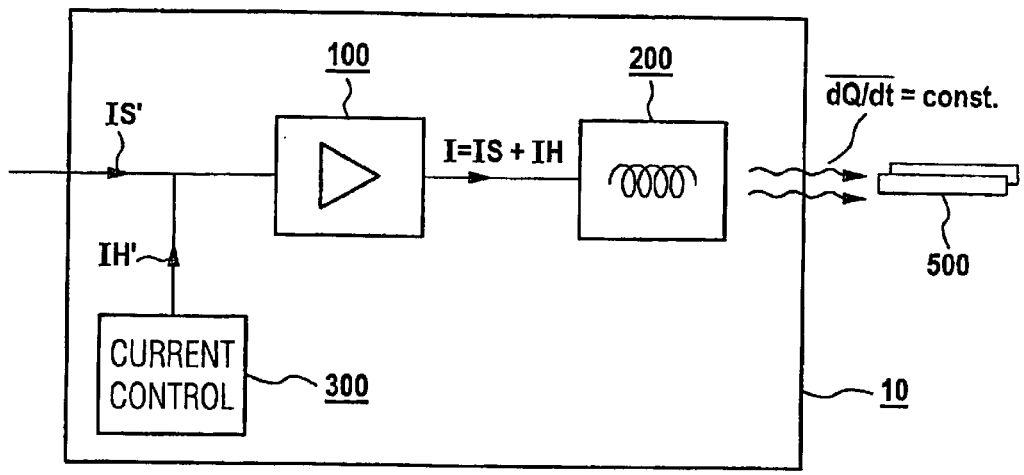
FIG. 1 is a block diagram of a coil system having current control means for adjustment of the current which is supplied to the coil, FIG. 2 has graphs of the time waveforms of the current components which are supplied to the coil.

Reference will now be made in detail to the preferred embodiments of the present invention, examples of which are illustrated in the accompanying drawings, wherein like reference numerals refer to like elements throughout.

FIG. 1 shows a coil system having an amplifier 100, a coil 200 and current control means 300. The coil system 10 is, in particular, a gradient coil system for a magnetic resonance appliance, which is not shown. The coil 200, in particular a gradient coil, is supplied with a current I by the amplifier 100. This current I is composed of a sequence current componet IS and a heating current component IH which are obtained by amplification from two unamplified current components IS' and IH' which are applied to the input of the amplifier 100.

The sequence current componets IS, which is in the form of a cyclic sequence signal and complies with the normal requirements for a magnetic resonance appliance, produces a (gradient) field when it passes through the coil 200.

The imaging accuracy of the magnetic resonance appliance depends essentially on the homogeneity of a basic magnetic field which is not shown in FIG. 1. Various methods are known for compensating for inhomogeneity of the basic magnetic field. For example, an active or a passive shim system may be used for this purpose. A passive shim system which is formed from a large number of iron shim plates 500 is in this case preferable to an active shim system, since it can be implemented more easily. However, the temperature dependency of the magnetic characteristic of the iron shim plates 500 is disadvantageous since a different compensation level is achieved depending on the temperature of the iron shim plates 500.

In order to avoid this disadvantageous effect, an additional heating current component IH is provided in addition to the sequence current component IS for the coil system 10 as shown in FIG. 1. This heating current component IH is adapted by the current control means 300 such that a mean heat power $$\overline{dQ/dt}$$

emitted from the coil 200 assumes a predetermined minimum value and, in particular, also remains virtually constant throughout the entire period of operation. This is because the disadvantageous temperature fluctuations in the iron shim plates 500 in a conventional coil system are governed to a very major extent by the varying heat emission from the coil 200 arranged in the immediate vicinity. Depending on the operating state, the sequence current component IS may have a different current magnitude and, furthermore, is distinguished by having sequence pauses of greater or lesser duration. The heat emission caused by the sequence current component IS is therefore also subject to fluctuations.

The heating current component IH is matched to the sequence current component IS at any given time such that the iron shim plates 500 are raised to temperatures which on average are higher than those with a conventional coil system but which are essentially constant. As soon as the thermal equilibrium is achieved after switching on the magnetic resonance appliance, the inhomogeneity of the basic magnetic field is thus compensated for very precisely.

The current control means 300 operates on the following principle. When a current sequence component IS at the maximum possible power is applied, the power of the heating current component IH is set virtually to zero. When the mean power level of the sequence current component IS is relatively low, the slaved heating current component IH produces the additional thermal power required in the coil 200. There is no risk of overloading, since the sum of the electrical power losses produced by the two current components IS and IH is approximately equal to the power loss caused by the maximum permissible sequence current component IS on its own and, in addition to this, is also less than the maximum permissible continuous power of the coil 200. The heating current component IH results in a thermal equilibrium, in particular without any upward or downward thermal drift. The iron shim plates 500 which are used for compensation then need be designed only for this thermal steady state.

The thermal effect of the heating current component IH in the coil 200 is desirable for the reasons which have been mentioned. On the other hand, any field-producing effect and hence any influence on the gradient field produced by the sequence current component IS should as far as possible be avoided. Imaging in a magnetic resonance appliance is always governed by the time integral of the gradient field strength. It is therefore advantageous for the heating current component IH to have a signal form with a negligible mean value over time. One suitable signal form for this purpose is, for example, a sinusoidal alternative current signal.

FIG. 2 shows the time waveforms of the sequence current component IH (at least schematically) and of two possible heating current components IH1 and IH2. Each of the graphs shows the current I plotted against the time t. The sequence current component IS is a switched pulse signal with a switching clock period TS1, which is composed of a sequence period TS2 and a sequence pause TS3. The sequence current component IS assumes values other than zero, which are relevant for field production, only during the sequence period TS2. No disturbance influences should therefore occur from the heating current component IH, particularly during the sequence period TS2.

The first suitable heating current component IH1 has a mean value of zero during the sequence period TS2. The sinusoidal signal which is used is in this case synchronized both to the sequence period TS2 and to the switching clock period TS1, so that the condition of a negligible mean value is satisfied in each case. A heating frequency f0 for the first heating current component IH1 is chosen in particular such that the sequence period TS2 is an integer multiple of the period duration TH of the heating current component IH. Furthermore, the heating frequency f0 is at least sufficiently high to ensure that the heating current component IH disappears on average within the sequence period TS2. Depending on the additional thermal power requirement, the amplitude of the heating current component IH may be raised during the sequence pause TS3, as illustrated in FIG. 2.

One alternative embodiment IH2 of a suitable heating current component has a current value of zero during the sequence period TS2. This automatically avoids any disturbance influence. In this embodiment, the heating current flows only during the sequence pause TS3. This is feasible in particular when the thermal time constant is longer than the switching clock period TS1. This results in there being no significant cooling down during the sequence period TS2, while the heating current flow resumes in the sequence pause TS3. In this embodiment as well, the mean power loss, that is to say the power loss average over the switching clock TS1, converted into heat in the coil 200 is of such a magnitude that the iron shim plates 500 are not subject to any significant temperature fluctuation.

Figure 3:
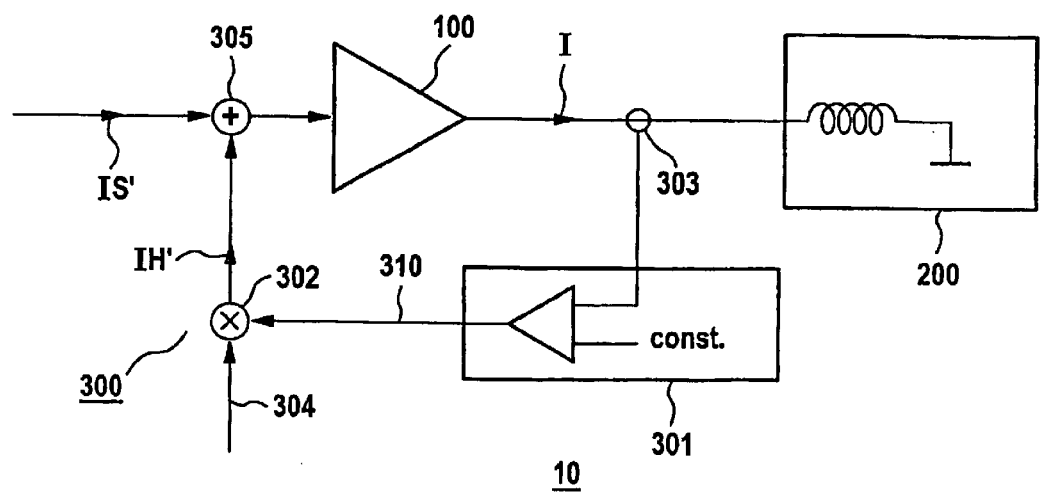
FIG. 3 is a circuit diagram for an exemplary embodiment of the current controller as illustrated schematically in FIG. 1.

FIG. 3 shows one specific exemplary embodiment of the current control means 300. In this exemplary embodiment, the current adjustment means 300 is formed by a control loop 310 with a real power sensor 303, with a regulator 301, with a weighting element 302 and with an addition element 305. The real power sensor 303 detects the power loss which is caused by the two current components IS and IH and is converted to heat in the coil 200. The value determined by the real power sensor 203 is compared with a predetermined constant nominal value in the regulator 301. The result of this comparison governs the weighting of an AC signal 304 in the weighting element 302. The unamplified heating current component IH' is produced at the output of the weighting element 302, and is superimposed in the addition element 305 on the unamplified sequence current component IS'. The total signal formed in this way is fed, after amplification in the amplifier 100, into the coil 200. The control loop 310 detects changes in the sequence current component IS and readjusts the heating current component IH until the predetermined real power level is set once again.

Instead of real power sensor 303, it is also possible to arrange at least one temperature sensor in the vicinity of the iron shim plates 500, which are not shown in FIG. 3. The temperature of the iron shim plates 500 is then used rather than the real power as the input variable for the regulator 301.

Figure 4:
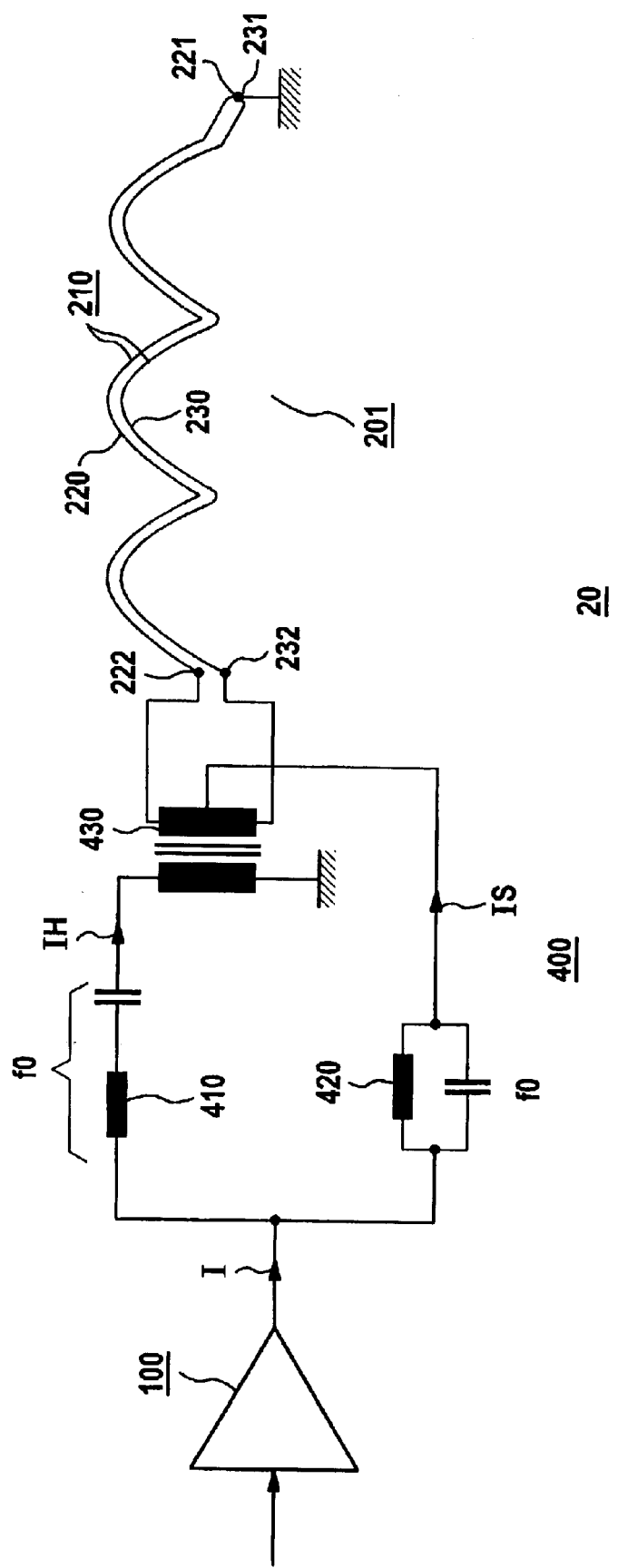
FIG. 4 is a circuit diagram for a two-strand exemplary embodiment of the coil with the associated circuitry.

FIG. 4 illustrates a further coil system 20. If the suppression of the field production produced by the heating current component IH as described in conjunction with FIGS. 1 and 2 is not sufficient, the conductor 210 which is used for the winding of a coil 201 can be split into two, as an additional measure. The conductor 210 is normally in the form of a stranded conductor. Splitting the individual strands into two halves results in a simple manner in two conductor elements 220 and 230, which are electrically short-circuited at their respective one end 221 and 231, and are connected to ground potential. It is not absolutely essential to ground the coil 201 at one end. An embodiment with a coil that is not grounded at either end is likewise possible.

At their respective second conductor end 222 and 232, the two conductor elements 220 and 230 are connected to circuitry 400 which are arranged between the amplifier 100 and the coil 201. These circuitry 400 include a bandpass filter 410 in the form of a series resonant circuit, a bandstop filter 420 in the form of a parallel resonant circuit, as well as a differential transformer 430. The bandpass filter 410 and the bandstop filter 420 are each tuned to the heating frequency f0. The branch element which contains the bandpass filter 410 carries the heating current component IH, while, on the other hand, the other branch element which includes the bandstop filter 420 carries the sequence current component IS.

Both branch elements are connected to the differential transformer 430 such that the sequence current component IS is fed into the coil 201 as if the two conductor ends 222 and 232 were short-circuited, and the heating current component IH is fed in as if the two conductor ends 222 and 232 were disconnected.

A two-conductor arrangement with a bifilar configuration is produced for the heating current component IH, which is in the form of a signal balanced about zero volts at the heating frequency f0. This thus results in bifilar heating. On the one hand, this suppresses any undesirable radiated emissions while, on the other hand, the very low self-inductance makes it possible to feed in a signal even at a relatively high heating frequency f0. However, with a bifilar arrangement of the two conductor elements 220 and 230, which has very high self-shielding, it is also possible to use a direct current signal for the heating current component IH.

For the sequence current component IS, there is no difference whatsoever compared with a pure single-conductor arrangement, so that this results in the desired production of the gradient field. Signal components and frequencies well away from the heating frequency f0, that is to say in particular including all the frequency components of the sequence current component IS are, specifically, passed via the bandstop filter 420 to the center tap (which is not shown in any more detail) of the differential transformer 430. The current is then split into equal halves, so that the flows in the differential transformer 430 compensate for one another. This avoids any risk of saturation in the differential transformer 430, even when the sequence current component IS is very high. Furthermore, there is no voltage drop along the secondary windings of the differential transformer 430, so that the two conductor elements 222 and 232 are at the same potential as the center tap. The coil 201 is thus operated as if it were formed from only a single, integral conductor.

It is also possible to use other frequency-selective components instead of the resonant circuits 410 and 420 illustrated in FIG. 4. These components always allow the two conductor elements 220 and 230 to be operated automatically and differently depending on the current component. In particular, this is ensured permanently and, above all, without any disturbing switching process. Furthermore, the differential transformer 430 may also itself be in the form of a resonant circuit.

The invention has been described in detail with particular reference to preferred embodiments thereof and examples, but it will be understood that variations and modifications can be effected within the spirit and scope of the invention.

What is claimed is:

1. A coil system, comprising:
   associated iron shim plates;
   an amplifier;
   a coil electrically connected to said amplifier; and
   current control means for adjusting current supplied from said amplifier to said coil such that, at least on average, a predetermined power loss is converted to heat in said coil and said iron shim plates are raised to elevated temperatures, said current control means including detection means for detecting the heat emitted from said coil.

2. The coil system as claimed in claim 1, wherein the current supplied to said coil is composed of a sequence current component and a heating current component.

3. The coil system as claimed in claim 2, wherein the heating current component has zero mean value.

4. The coil system as claimed in claim 2, wherein a frequency of the heating current component and a switching clock for the sequence current component are synchronized to one another.

5. The coil system as claimed in claim 2, wherein a time integral of the heating current component over one sequence period of the sequence current component is equal to zero.

6. The coil system as claimed in claim 2, wherein the heating current component is not zero only during a sequence pause in the sequence current component.

7. The coil system as claimed in claim 2, wherein said current control means includes means for variable matching of heating power produced by the heating current component in said coil, to the heating power produced by the sequence current component in said coil.

8. The coil system as claimed in claim 1, wherein said coil is a z-gradient coil of a magnetic resonance appliance.

9. The coil system as claimed in claim 1, wherein said detection means includes a real power sensor.

10. The coil system as claimed in claim 1, wherein said detection means includes a temperature sensor.

11. A coil system, comprising:
   an amplifier;
   a coil electrically connected to said amplifier; and
   current control means, including a control loop for current regulation, for adjusting current supplied from said amplifier to said coil such that, at least on average, a predetermined power loss is converted to heat in said coil.

12. A coil system, comprising:
   an amplifier;
   a coil, electrically connected to said amplifier, having two conductor elements; and
   current control means for adjusting current supplied from said amplifier to said coil such that, at least on average, a predetermined cower loss is converted to heat in said coil.

13. The coil system as claimed in claim 12, wherein the two conductor elements are arranged in a bifilar manner.

14. The coil system as claimed in claim 12, wherein the two conductor elements are short-circuited at respective first conductor ends.

15. The coil system as claimed in claim 12, wherein said coil includes circuitry means at respective second conductor ends of the two conductor elements to at least one of short-circuiting and disconnecting the second conductor ends.

16. A method for controlling a coil system including a coil with associated iron shim plates and an amplifier electrically connected thereto, comprising:
   adjusting current supplied from the amplifier to the coil such that, at least on average, a predetermined power loss is converted to heat in the coil and the iron shim plates are raised to elevated temperatures, and detecting the heat emitted from the coil.

* * * * *